(12) United States Patent
Watanabe et al.

(10) Patent No.: US 10,369,632 B2
(45) Date of Patent: Aug. 6, 2019

(54) COATED TOOL

(71) Applicant: KYOCERA CORPORATION, Kyoto-shi, Kyoto (JP)

(72) Inventors: Kensaku Watanabe, Satsumasendai (JP); Yoshikazu Kodama, Satsumasendai (JP); Takahito Tanibuchi, Satsumasendai (JP)

(*) Notice: Subject to any disclaimer, the term of this patent is extended or adjusted under 35 U.S.C. 154(b) by 128 days.

(21) Appl. No.: 15/506,804

(22) PCT Filed: Aug. 22, 2015

(86) PCT No.: PCT/JP2015/073639
§ 371 (c)(1),
(2) Date: Feb. 27, 2017

(87) PCT Pub. No.: WO2016/031741
PCT Pub. Date: Mar. 3, 2016

(65) Prior Publication Data
US 2017/0246692 A1    Aug. 31, 2017

(30) Foreign Application Priority Data
Aug. 28, 2014  (JP) ................................. 2014-174098

(51) Int. Cl.
*B23B 27/14*        (2006.01)
*C23C 16/36*        (2006.01)
(Continued)

(52) U.S. Cl.
CPC ............ *B23B 27/148* (2013.01); *B23B 27/14* (2013.01); *C23C 16/0272* (2013.01);
(Continued)

(58) Field of Classification Search
USPC .......... 51/307, 309; 428/212, 698, 701, 702; 407/119
See application file for complete search history.

(56) References Cited

U.S. PATENT DOCUMENTS 5,487,625 A    1/1996  Ljungberg et al.
5,654,035 A    8/1997  Ljungberg et al.
(Continued)

FOREIGN PATENT DOCUMENTS

CN    102441686 A    5/2012
EP      0603144 A1    6/1994
(Continued)

OTHER PUBLICATIONS

Black et al "Certification of Standard Reference Material 1976B" Powder Diffraction 30 (3) (2015) p. 199-204. (Year: 2015).*
(Continued)

*Primary Examiner* — Archene A Turner
(74) *Attorney, Agent, or Firm* — Viering, Jentschura & Partner MBB

(57) ABSTRACT

A coated tool is, for example, a cutting tool which is provided with a base material and a coating layer located on the base material, wherein a cutting edge and a flank surface are located on the coating layer, the coating layer has a portion in which at least a titanium carbonitride layer and an aluminum oxide layer having an α-type crystal structure are laminated in this order, and, with regard to a texture coefficient (Tc) (hkl) which is calculated on a basis of a peak of the aluminum oxide layer analyzed by an X-ray diffraction analysis, a texture coefficient (Tc1) (146) as measured from a surface side of the aluminum oxide layer in the flank surface is 1 or more.

7 Claims, 2 Drawing Sheets

(51) Int. Cl.
*C23C 16/40* (2006.01)
*C23C 16/02* (2006.01)
*C23C 28/04* (2006.01)

(52) U.S. Cl.
CPC ............ *C23C 16/36* (2013.01); *C23C 16/403* (2013.01); *C23C 28/042* (2013.01); *C23C 28/044* (2013.01); *B23B 2200/0471* (2013.01); *B23B 2224/04* (2013.01); *B23B 2224/32* (2013.01); *B23B 2228/04* (2013.01); *B23B 2228/105* (2013.01); *B23B 2228/36* (2013.01)

(56) References Cited

U.S. PATENT DOCUMENTS

| | | | |
|---|---|---|---|
| 2006/0199026 A1* | 9/2006 | Ruppi | C23C 16/029 428/472 |
| 2008/0298921 A1* | 12/2008 | Sundstrom | C23C 16/0272 428/336 |
| 2009/0061091 A1 | 3/2009 | Ruppi | |
| 2009/0214857 A1* | 8/2009 | Itoh | C23C 16/403 428/336 |
| 2009/0269150 A1* | 10/2009 | Omori | B23B 27/141 407/114 |
| 2014/0377024 A1 | 12/2014 | Sobana et al. | |
| 2016/0201192 A1* | 7/2016 | Tanibuchi | C23C 16/403 428/213 |

FOREIGN PATENT DOCUMENTS

| | | |
|---|---|---|
| EP | 2799168 A1 | 11/2014 |
| EP | 3199277 A1 | 8/2017 |
| JP | H06316758 A | 11/1994 |
| JP | H10204639 A | 8/1998 |
| JP | 2003025114 A | 1/2003 |
| JP | 2009202264 A | 9/2009 |
| JP | 2013132717 A | 7/2013 |
| WO | WO 2015/030073 * | 3/2014 |

OTHER PUBLICATIONS

The extended European Search Report based on Application No. 15836576.7 dated Feb. 20, 2018, 7 pages (Reference Purpose Only).
Office Action received for Chinese Patent Application No. 201580045480.6, dated Jan. 25, 2018, 10 pages including 3 pages of its English translation and 1 page of Statement of Relevance of Non-English Reference.

* cited by examiner

COATED TOOL

RELATED APPLICATIONS

The present application is a national stage entry according to 35 U.S.C. § 371 of PCT application No.: PCT/JP2015/073639 filed on Aug. 22, 2015, which claims priority from Japanese application No.: 2014-174098 filed on Aug. 28, 2014, and is incorporated herein by reference in its entirety.

TECHNICAL FIELD

The present invention relates to a coated tool comprising a base material and a coating layer located on a surface of the base material.

BACKGROUND ART

Conventionally, coated tools are known, such as a cutting tool in which one or multiple coating layers such as titanium carbide layers, titanium nitride layers, titanium carbonitride layers, aluminum oxide layers, and titanium nitride aluminum layers are formed on the surface of a base material such as a cemented carbide, a cermet, a ceramic material or the like.

The occasions where the cutting tool is used for heavy-load intermittent cutting in which a large impact is applied to a cutting edge or the like are increased with the recent increase in the efficiency of cutting processing. Under such severe cutting conditions, a large impact is applied to the coating layer, and chipping or the detachment of a coating layer tends to occur. Thus, the improvement in fracture resistance of the coating layer has been demanded for preventing the occurrence of chipping or the detachment of the coating layer.

As a technique for improving fracture resistance in a cutting tool as mentioned above, Patent Document 1 discloses a technique whereby it becomes possible to optimize the grain diameters and the layer thickness of an aluminum oxide layer and to adjust the texture coefficient on face (012) to 1.3 or more to form an aluminum oxide layer that is dense and has high fracture resistance. Patent Document 2 discloses a technique whereby it becomes possible to adjust the texture coefficient on face (012) in an aluminum oxide layer to 2.5 or more to make the residual stress in the aluminum oxide layer to be released easily, thereby improving the fracture resistance of the aluminum oxide layer.

As a technique for improving wear resistance of a cutting tool as mentioned above, Patent Document 3 discloses a technique whereby it becomes possible to improve strength and toughness of a coating film by forming an aluminum oxide layer located immediately above an intermediate layer by laminating at least two unit layers having different X-ray diffraction patterns from each other to form the aluminum oxide layer.

Patent Document 4 discloses a cutting tool in which the texture coefficient on face (006) in an aluminum oxide layer is increased to 1.8 or more and the peak intensity ratio I(104)/I(110) between the peak intensity on face (104) and the peak intensity on face (110) is adjusted to a value falling within a specific range.

Patent Document 5 discloses a cutting tool in which the peak intensity ratio I(104)/I(012) between the peak intensity on face (104) to the peak intensity on face (012) in an aluminum oxide layer is adjusted in such a manner that the peak intensity ratio in a first surface of the aluminum oxide layer is larger than that in a second surface of the aluminum oxide layer.

RELATED ART DOCUMENTS

Patent Documents

Patent Document 1: Japanese Patent No. 6-316758
Patent Document 2: Japanese Unexamined Patent Publication No. 2003-025114
Patent Document 3: Japanese Unexamined Patent Publication No. 10-204639
Patent Document 4: Japanese Unexamined Patent Publication No. 2013-132717
Patent Document 5: Japanese Unexamined Patent Publication No. 2009-202264

SUMMARY OF THE INVENTION

Means for Solving the Problems

The coated tool according to the present embodiment has a base material and a coating layer located on a surface of the base material, wherein a cutting edge and a flank surface are located on the coating layer, the coating layer has a portion in which at least a titanium carbonitride layer and an aluminum oxide layer having an α-type crystal structure are laminated in this order, and a texture coefficient Tc1 (146) detected in measurement from a surface side of the aluminum oxide layer in the flank surface is 1.0 or more, wherein the texture coefficient Tc (hkl) is a value expressed by the formula shown below on the basis of a peak of the aluminum oxide layer analyzed by an X-ray diffraction analysis:

a texture coefficient Tc (hkl)={I(hkl)/I$_0$(hkl)}/[(⅛)×Σ{I(HKL)/I$_0$(HKL)}]

wherein (HKL) represents a crystal face (012), (104), (110), (113), (024), (116), (214) or (146);

each of I(HKL) and I(hkl) represents a peak intensity of a peak which is attributed to each crystal face and is detected by an X-ray diffraction analysis of the aluminum oxide layer; and each of I$_0$(HKL) and I$_0$(hkl) represents a reference diffraction intensity of each crystal face contained in a JCPDS card No. 00-010-0173.

EMBODIMENTS FOR CARRYING OUT THE INVENTION

Figure 1:
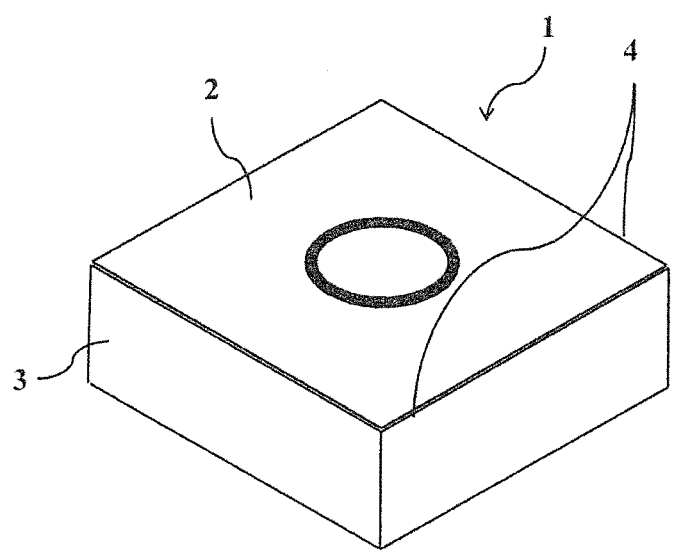
FIG. 1 shows a schematic perspective view of a cutting tool that is an example of the coated tool according to this embodiment.

As illustrated in FIG. 1, a cutting tool (simply abbreviated as "a tool", hereinbelow) 1 which is an aspect of the coated tool according to the present embodiment has such a configuration that one main surface and the side surface of the tool 1 serve as a rake surface 2 and a flank surface 3, respectively, and the intersecting ridgeline portion between the rake surface 2 and the flank surface 3 serves as a cutting edge 4.

Figure 2:
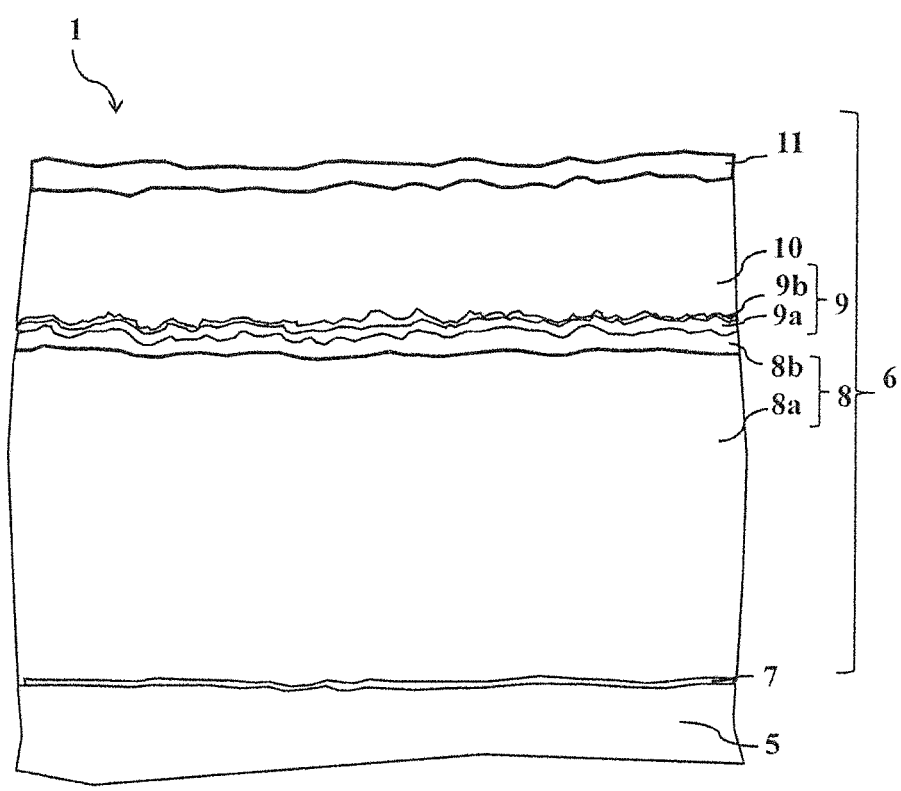
FIG. 2 shows a schematic cross-sectional view of the cutting tool illustrated in FIG. 1.

As illustrated in FIG. 2, the tool 1 comprises a base material 5 and a coating layer 6 located on a surface of the base material 5. The coating layer 6 is a laminate composed of an underlayer 7, a titanium carbonitride layer 8, an intermediate layer 9, an aluminum oxide layer 10 and a surface layer 11 in this order as observed from a side of the base material 5. The aluminum oxide layer 10 has an α-type crystal structure.

In this aspect, a value which is expressed by the formula shown below in a peak of the aluminum oxide layer 10 as determined by an X-ray diffraction analysis is defined as a texture coefficient Tc (hkl).

A texture coefficient Tc (hkl)=$\{I(hkl)/I_0(hkl)\}/[(\frac{1}{8})\times\Sigma\{I(HKL)/I_0(HKL)\}]$ wherein (HKL) represents a crystal face (012), (104), (110), (113), (024), (116), (214) or (146);

each of I(HKL) and I(hkl) represents a peak intensity of a peak attributed to each crystal face which is detected in the X-ray diffraction analysis of the aluminum oxide layer 10;

each of $I_0$(HKL) and $I_0$(hkl) represents a reference diffraction intensity of each crystal face which is contained in a JCPDS card No. 00-010-0173; and Tc1 is defined as a texture coefficient of a surface side peak as measured from the surface side of the aluminum oxide layer 10 in the flank surface 3, Tc2 is defined as a texture coefficient of a base material side peak which is detected in the measurement in which a portion of the aluminum oxide layer 10 is polished to allow only the base material side portion of the aluminum oxide layer 10 to leave in the flank surface 3, and Tc3 is defined as a texture coefficient of the surface side peak as measured from the surface side of the aluminum oxide layer 10 in the rake surface 2.

According to this embodiment, the texture coefficient Tc1 (146) is 1.0 or more. In this case, the wear resistance of the aluminum oxide layer 10 is improved. As the result, a tool 1 which can be used for a prolonged period can be produced. It is considered that, when the texture coefficient Tc (146) is increased, in other words, the ratio of the peak intensity I(146) of face (146) is increased, aluminum oxide crystals that constitute the aluminum oxide layer 10 are likely to bow against the impact applied to the aluminum oxide layer 10 in the film formation direction (i.e., a direction perpendicular to the surface) from the surface side and therefore the resistance to fracture can be improved. Therefore, it is considered that, on the surface side of the aluminum oxide layer 10, it becomes possible to prevent the occurrence of fine chipping on the surface of the aluminum oxide layer 10 to prevent the progression of wearing caused by the fine chipping by increasing the texture coefficient Tc (146). The preferred range of the Tc1 (146) is 1.1 to 5.0, particularly preferably 1.5 to 3.5, and more preferably 1.8 to 3.0.

According to this aspect, when Tc1 (146) is compared with Tc2 (146), Tc1 (146) is larger than Tc2 (146). In other words, Tc2 (146) is smaller than Tc1 (146). When the texture coefficient Tc1 (146) is increased, the coefficient of thermal expansion in a direction parallel to the surface of the aluminum oxide layer 10 is increased, and thus the difference between this coefficient of thermalexpansion and the coefficient of thermalexpansion in the intermediate layer 9 and the titanium carbonitride layer 8 which are layers located closer to the base material than the aluminum oxide layer 10 does and located below the aluminum oxide layer 10 is increased and therefore the aluminum oxide layer 10 is likely to detach.

Then, the detachment of the aluminum oxide layer 10 can be prevented by reducing the Tc2 (146) to a value smaller than the Tc1 (146). The preferable range of Tc2 (146) is 0.3 to 1.5.

The method for measuring Tc1 (146) and Tc2 (146) of the aluminum oxide layer 10 is described hereinbelow. The X-ray diffraction analysis on the aluminum oxide layer 10 is carried out with a conventional X-ray diffraction analysis device using a CuKα line. For determining the peak intensity of each crystal face of the aluminum oxide layer 10 from an X-ray diffraction chart, the diffraction angle of each crystal face which is contained in a JCPDS card No. 00-010-0173 is checked, the crystal face of the detected peak is identified, and then the peak intensity of the peak is measured.

In this regard, the identification of a peak detected by the X-ray diffraction analysis is carried out using a JCPDS card. In this case, however, the position of the peak is sometimes displaced by the action of a residual stress remaining in the coating layer 6 or the like. Therefore, for confirming whether or not the detected peak is a peak of the aluminum oxide layer 10, the X-ray diffraction analysis is carried out in such a state that the aluminum oxide layer 10 is polished, and peaks detected before and after the polishing are compared with each other. From this difference, it becomes possible to confirm that the peak is a peak of the aluminum oxide layer 10.

For the measurement of Tc1 (hkl), a surface side peak which is measured from the surface side of the aluminum oxide layer 10 in the flank surface 3 is measured. Specifically, a peak intensity of the aluminum oxide layer 10, including the surface side of the aluminum oxide layer 10 to the side of the base material 5 of the aluminum oxide layer 10, is measured. More specifically, the X-ray diffraction analysis on the coating layer 6 is carried out in such a state that the surface layer 11 is removed by polishing or in such a state that the surface layer 11 is not polished. The peak intensity of each of the obtained peaks is measured, and the texture coefficient Tc1 (hkl) is calculated. In the removal of the surface layer 11 by polishing, only a portion having a thickness of 20% or less of the thickness of the aluminum oxide layer 10 may be removed. Alternatively, the X-ray diffraction analysis may be carried out without polishing the surface layer 11, as long as eight peaks of aluminum oxide can be measured. The surface side peak is detected including the oriented state on the side of the base material 5 of the aluminum oxide layer 10. Because the state of the structure of the aluminum oxide layer at a position located close to a surface of the aluminum oxide layer to be measured by the X-ray diffraction analysis more greatly affects a peak, the influence of the oriented state on the side of the base material 5 on the surface side peak is small. Tc3 (hkl) is measured in the same manner on the basis of the surface side peak of the aluminum oxide layer 10 in the rake surface 2.

For the measurement of Tc2 (hkl), the peak intensity is measured in such a state that a portion of the aluminum oxide layer 10 in the flank surface 3 is polished to allow only the base material portion of the aluminum oxide layer 10 to leave. Specifically, at first, the aluminum oxide layer 10 in the coating layer 6 is polished until the thickness of the aluminum oxide layer 10 becomes 10 to 40% of the thickness of the unpolished aluminum oxide layer 10. The polishing is carried out by a brush processing with diamond abrasive grains, a processing with an elastic grind stone, a blast processing or the like. Subsequently, a polished portion of the aluminum oxide layer 10 is subjected to an X-ray diffraction analysis under the same conditions as those employed for the measurement on the surface side portion of the aluminum oxide layer 10 to measure a peak of the aluminum oxide layer 10, and then the texture coefficient Tc2 (hkl) is calculated.

The texture coefficient Tc can be determined as a ratio relative to the non-oriented standard data as defined in a JCPDS card, and is therefore a measure that indicates the degree of orientation of each crystal face. The term. "(hkl)" in Tc (hkl) refers to a crystal face of which the texture coefficient is to be calculated.

According to this aspect, in the surface side peaks measured from the surface side of the aluminum oxide layer 10 in the flank surface 3, I(116) and I(104) are first most-intense and second most-intense, respectively. In this case, the occurrence of flank wearing caused by fine chipping in the flank surface 3 is likely to be prevented. I(146) has a peak intensity in the top 8 in the peak intensities, particularly desirably third most-intense to sixth most-intense in the peak intensities.

According to this aspect, the texture coefficient Tc3 (104) is smaller than Tc1 (104). In this case, the occurrence of crater wear on the rake surface 2 can be prevented and the chipping resistance on the flank surface 3 can also be reduced.

As the result of a test, it is found that the chipping resistance of the aluminum oxide layer 10 cannot be improved sufficiently merely by adjusting Tc1 (104) to a value larger than Tc3 (104) and the crater wear resistance of the aluminum oxide layer 10 can be improved greatly when the Tc1 (146) is 1.0 or more.

The titanium carbonitride layer 8 is composed of a laminate of a so-called MT (moderate temperature)-titanium carbonitride layer 8a and an HT-titanium carbonitride layer 8b which are laminated in this order from the side of the base material. The MT-titanium carbonitride layer 8a is composed of columnar crystals which contain an acetonitrile ($CH_3CN$) gas as a raw material and is made into a film at a relatively low film formation temperature of 780 to 900° C. The HT (high temperature)-titanium carbonitride layer 8b is composed of granular crystals which are formed into a film at a high film formation temperature of 950 to 1100° C. According to this aspect, triangle-shaped protrusions which are tapered toward the aluminum oxide layer 10 as observed cross-sectionally are formed on the surface of the HT-titanium carbonitride layer 8b, and the formation of the protrusions enables the increase in adhesion force of the aluminum oxide layer 10 and the prevention of the detachment of the coating layer 6 or chipping.

According to this aspect, an intermediate layer 9 is located on the surface of the HT-titanium carbonitride layer 8b. The intermediate layer 9 contains titanium and oxygen, and is composed of, for example, TiCO, TiNO, TiCNO, TiAlCO, TiAlCNO or the like. In FIG. 2, the intermediate layer 9 is composed of a laminate of a lower intermediate layer 9a and an upper intermediate layer 9b. In this case, each of aluminum oxide particles that constitute the aluminum oxide layer 10 has an α-type crystal structure. The aluminum oxide layer 10 having an α-type crystal structure is highly hard and can increase the wear resistance of the coating layer 6. When the intermediate layer 9 has a laminated structure composed of a lower intermediate layer 9a made from TiAlCNO and an upper intermediate layer 9b made from. TiCNO, an effect of increasing the fracture resistance of the cutting tool 1 can be achieved. Further, when the intermediate layer 9 is composed of TiCO or TiAlCO, Tc1 (146) and Tc2 (146) can be increased. The titanium carbonitride layer 8 is provided at a thickness of 6.0 to 13.0 μm, and the intermediate layer 9 is provided at a thickness of 0.05 to 0.5 μm.

Each of the underlayer 7 and the surface layer 11 is made from titanium nitride. In other aspects, the underlayer 7 and the surface layer 11 may be made from other materials such as titanium carbonitride, titanium carboxynitride, and chromium nitride other than titanium nitride, and at least one of the underlayer 7 and the surface layer 11 may be eliminated. The underlayer 7 is provided at a thickness of 0.1 to 1.0 μm, and the surface layer 11 is provided at a thickness of 0.1 to 3.0 μm.

The thickness of each layer and the properties of crystals constituting each layer can be determined by observing an electron microscope image (a scanning electron microscope (SEM) image or a transmission electron microscope (TEM) image) of a cross section of the tool 1. In this embodiment, the wording "the crystal morphology of crystals constituting each layer in the coating layer 6 is columnar" means that the ratio of the above-mentioned average crystal width to the length of each of the crystals in the direction of the thickness of the coating layer 6 is 0.3 or less on average. On the other hand, when the ratio of the average crystal width to the length of each of the crystals in the direction of the thickness of the coating layer is more than 0.3 on average, it is defined that the morphology of the crystals is granular.

On the other hand, the base material 5 in the tool 1 can comprise a cemented carbide or Ti-based cermet which is produced by binding a hard phase comprising tungsten carbide (WC) and optionally at least one component selected from the group consisting of a carbide, a nitride and a carbonitride of a metal belonging to Groups 4, 5 or 6 on the periodic table to a binding phase comprising an iron-group metal such as cobalt (Co) and nickel (Ni), or a ceramic material such as $Si_3N_4$, $Al_2O_3$, diamond and cubic boron nitride (cBN). Among these materials, when used as a cutting tool like the tool 1, the base material 5 preferably comprises a cemented carbide or a cermet, from the viewpoint of fracture resistance and wear resistance. Depending on the intended use, the base material 5 may comprise a metal such as a carbon steel, a high speed steel and an alloy steel.

Furthermore, the cutting tool is so configured that the cutting edge 4 formed at an intersection part between the rake surface 2 and the flank surface 3 is put to an object to be cut to cut/process the object, and can exert the above-mentioned excellent effects. The cutting tool according to this embodiment can be used as a cutting tool, and also can be used in various use applications including a digging tool and a knife. In this case, excellent mechanical reliability can be achieved.

Next, the method for producing the coated tool according to the present embodiment will be described with reference to an example of the method for producing the tool 1.

The base material 5 made from a hard alloy is produced by appropriately adding a metal powder, a carbon powder or the like to a powder of an inorganic material such as a metal carbide, a nitride, a carbonitride and an oxide, which can be formed into the hard alloy that can serve as the base material 5 by sintering, then agitating the mixture, then molding the agitated mixture into a predetermined tool shape by a known molding method such as press molding, cast molding, extrusion molding and cold isostatic press molding, and then sintering the molded product under vacuum or in a non-oxidative atmosphere. If desired, the surface of the base material 5 is subjected to a polishing processing or a cutting edge honing processing.

Subsequently, a coating layer is formed on the surface of the base material 5 by a chemical vapor deposition (CVD) method.

At first, a mixed gas composed of 0.5 to 10 volume % of a titanium tetrachloride ($TiCl_4$) gas, 10 to 60 volume % of a nitrogen ($N_2$) gas and a remainder made up by a hydrogen ($H_2$) gas is prepared as a reaction gas composition and then introduced into a chamber, and a TiN layer that serves as an underlayer 7 is formed at a film formation temperature of 800 to 940° C. and at 8 to 50 kPa.

Subsequently, a mixed gas composed of, in volume %, 0.5 to 10 volume % of a titanium tetrachloride ($TiCl_4$) gas, 5 to 60 volume % of a nitrogen ($N_2$) gas, 0.1 to 3.0 volume % of an acetonitrile ($CH_3CN$) gas and a remainder made up by a hydrogen ($H_2$) gas is prepared as reaction gas composition and then introduced into a chamber, and a MT-titanium carbonitride layer is formed at a film formation temperature of 780 to 880° C. and at 5 to 25 kPa. In this case, the content ratio of the acetonitrile ($CH_3CN$) gas in the later stage of the film formation is increased compared with that in the initial stage of the film formation, whereby the average crystal width of the titanium carbonitride columnar crystals that constitute the titanium carbonitride layer in the surface side can be increased compared with that in the side of the base material.

Subsequently, a HT-titanium carbonitride layer, which constitutes the upper side portion of the titanium carbonitride layer 8, is formed. According to this aspect, specific film formation conditions for the HT-titanium carbonitride layer are as follows: a mixed gas composed of 1 to 4 volume % of a titanium tetrachloride ($TiCl_4$) gas, 5 to 20 volume % of a nitrogen ($N_2$) gas, 0.1 to 10 volume % of a methane ($CH_4$) gas and a remainder made up by a hydrogen ($H_2$) gas is prepared and then introduced into a chamber, and the layer is formed at a film formation temperature of 900 to 1050° C. and at 5 to 40 kPa.

Subsequently, an intermediate layer 9 is produced. Specific film formation conditions in this aspect are as follows: at a first stage, a mixed gas composed of 3 to 30 volume % of a titanium tetrachloride ($TiCl_4$) gas, 3 to 15 volume % of a methane ($CH_4$) gas, 5 to 10 volume % of a nitrogen ($N_2$) gas, 0.5 to 1 volume % of a carbon monooxide (CO) gas, 0.5 to 3 volume % of an aluminum trichloride ($AlCl_3$) gas and a remainder made up by a hydrogen ($H_2$) gas is prepared. After the preparation, the mixed gas is introduced into a chamber, and a film is formed at a film formation temperature of 900 to 1050° C. and at 5 to 40 kPa. According to this process, an intermediate layer 9 having an uneven surface can be formed on the surface of the titanium carbonitride layer 8.

Subsequently, as a second stage of the production of the intermediate layer 9, a mixed gas composed of 3 to 15 volume % of a titanium tetrachloride ($TiCl_4$) gas, 3 to 10 volume % of a methane ($CH_4$) gas, 10 to 25 volume % of a nitrogen ($N_2$) gas, 0.5 to 2.0 volume % of a carbon monooxide (CO) gas and a remainder made up by a hydrogen ($H_2$) gas is prepared. After the preparation, the mixed gas is introduced into a chamber, and a film is formed at a film formation temperature of 900 to 1050° C. and at 5 to 40 kPa. In this process, the nitrogen ($N_2$) gas may be replaced by an argon (Ar) gas. According to this process, the unevenness of the surface of the intermediate layer 9 can become fine to control the state of the growth of aluminum oxide crystals in an aluminum oxide layer 10 that is to be formed in the subsequent step.

Subsequently, an aluminum oxide layer 10 is formed. At first, cores for aluminum oxide crystals are formed. The formation is carried out using a mixed gas composed of 5 to 10 volume % of an aluminum trichloride ($AlCl_3$) gas, 0.1 to 1.0 volume % of a hydrogen chloride (HCl) gas, 0.1 to 5.0 volume % of a carbon dioxide ($CO_2$) gas and a remainder made up by a hydrogen ($H_2$) gas at 950 to 1100° C. and at 5 to 10 kPa. Through this first film formation stage, the state of the growth of aluminum oxide crystals to be formed into a film can be altered to control the Tc2 (146) of the aluminum oxide layer 10.

Subsequently, a film is formed using a mixed gas composed of 0.5 to 5.0 volume % of an aluminum trichloride ($AlCl_3$) gas, 1.5 to 5.0 volume % of a hydrogen chloride (HCl) gas, 0.5 to 5.0 volume % of a carbon dioxide ($CO_2$) gas, 0 to 1.0 volume % of a hydrogen sulfide ($H_2S$) gas and a remainder made up by a hydrogen ($H_2$) gas at 950 to 1100° C. and at 5 to 20 kPa. Through this second film formation stage, the state of growth of aluminum oxide crystals that are to be formed into a film on the side of the intermediate layer of the aluminum oxide layer 10 can be controlled to control the Tc2 (146).

Subsequently, an aluminum oxide layer 10 is formed using a mixed gas composed of 5 to 15 volume % of an aluminum trichloride ($AlCl_3$) gas, 0.5 to 2.5 volume % of a hydrogen chloride (HCl) gas, 0.5 to 5.0 volume % of a carbon dioxide ($CO_2$) gas, 0.1 to 1.0 volume % of a hydrogen sulfide ($H_2S$) gas and a remainder made up by a hydrogen ($H_2$) gas at 950 to 1100° C. and at 5 to 20 kPa. Through this third film formation stage, the state of growth of the aluminum oxide crystals that are to be formed into a film on the surface side of the aluminum oxide layer 10 can be controlled to control the Tc1 (146). The second and third stages in the film formation step of the aluminum oxide layer 10 are not independent steps, and the composition of the mixed gas may change continuously.

If desired, a surface layer (a TiN layer) 11 is formed. Specific film formation conditions are as follows: a mixed gas composed of 0.1 to 10 volume % of a titanium tetrachloride ($TiCl_4$) gas, 10 to 60 volume % of a nitrogen ($N_2$) gas and a remainder made up by a hydrogen ($H_2$) gas is prepared as a reaction gas composition and then introduced into a chamber, and a film is formed at a film formation temperature of 960 to 1100° C. and at 10 to 85 kPa.

Subsequently, if desired, at least a cutting edge part on the surface of the formed coating layer 6 is processed by polishing. Through this processing by polishing, the cutting edge part can be made smooth, the welding of the workpiece material can be prevented, and a tool having superior fracture resistance can be produced. The Tc3 (104) can be adjusted by, for example, polishing only the rake surface.

EXAMPLES

At first, 6% by mass of a metal cobalt powder having a mean particle diameter of 1.2 μm, 0.5% by mass of a titanium carbide powder having a mean particle diameter of 2.0 μm, 5% by mass of a niobium carbide powder having a mean particle diameter of 2.0 μm and, as a remainder, a tungsten carbide powder having a mean particle diameter 1.5 μm were added in this content ratio and then mixed together, and the resultant mixture was molded into a tool shape (CNMG120408) by press molding. Subsequently, the molded product was subjected to a binder removal treatment and then sintered at 1500° C. under vacuum of 0.01 Pa for 1 hour to produce a base material composed of a cemented carbide. Subsequently, the resultant base material was subjected to a brush processing, and a portion that served as a cutting edge was R-honed.

Subsequently, a coating layer was formed on the base material composed of the cemented carbide by a chemical vapor deposition (CVD) method under the film formation conditions shown in Table 1 and subjecting the rake surface to a polishing processing as for sample Nos. 1 to 10 to produce a cutting tool. In Tables 1 and 2, the name of each compound was expressed in its chemical symbol.

In the above-mentioned sample, an X-ray diffraction analysis with CuKα line was carried out on the rake surface without polishing the coating layer, and a texture coefficient Tc3 (hkl) of each of crystal faces (146), (104) and (116) in a JCPDS card was calculated. Subsequently, an X-ray diffraction analysis with CuKα line was carried out on the flattened surface of the flank surface without polishing the coating layer, and a surface side peak (in the tables, referred to as "surface side" or "surface side peak") measured from the surface side of the aluminum oxide layer was identified and a peak intensity of each peak was measured. The first most-intense peak and the second most-intense peak in the surface side peaks were confirmed, and a texture coefficient Tc1 (hkl) of each of the crystal faces (146), (104) and (116) in the JCPDS card was calculated. The flank surface was polished until the thickness became 10 to 40% of the thickness of the aluminum oxide layer, and then subjected to an X-ray diffraction analysis in the same manner as mentioned above to identify a base material side peak (in the tables, referred to as "base material side") measured in such a state that a portion of the aluminum oxide layer was polished to allow only the base material side to leave and the peak intensity of each peak was measured. By employing the peak intensity of each peak, a texture coefficient Tc2 (hkl) of each of crystal faces (146), (104) and (116) was calculated. In the above-mentioned X-ray diffraction measurements, the measurement was carried out on arbitrary three samples and an average of the results on the three samples was employed for the evaluation. In addition, the fracture surface of the tool was observed on a scanning electron microscope (SEM) to measure the thickness of each layer. The results are shown in Tables 2 to 4.

Subsequently, a continuous cutting test and an intermittent cutting test were carried out using the resultant cutting tool under the below-mentioned conditions to evaluate wear resistance and fracture resistance. The results are shown in Table 4.

(Continuous Cutting Conditions)
Workpiece material: a chromium molybdenum steel material (SCM435)
Tool shape: CNMG120408
Cutting speed: 300 m/min
Feed speed: 0.3 mm/rev
Depth of cut: 1.5 mm
Cutting time: 25 min
Other: a water-soluble cutting solution was used
Items of evaluation: a honed cutting edge was observed on a scanning electron microscope, and a flank wear width in a flank surface and a crater wear width in a rake surface in an actually worn portion were measured.

(Intermittent Cutting Conditions)
Workpiece material: a chromium molybdenum steel, a four-grooved steel material (SCM440)
Tool shape: CNMG120408
Cutting speed: 300 m/min
Feed speed: 0.3 mm/rev
Depth of cut: 1.5 mm
Other: a water-soluble cutting solution was used
Item of evaluation: the number of impacts that might trigger defects was measured.

TABLE 1

| Coating layer | Mixed gas composition (% by volume) | Chamber temperature (° C.) | Pressure (kPa) |
|---|---|---|---|
| TiN-1 | $TiCl_4$: 2.5, $N_2$: 23, $H_2$: balance | 900 | 16 |
| TiCN-1(MT) | $TiCl_4$: 1.0, $N_2$: 10, $CH_3CN$: 0.1→0.4, $H_2$: balance | 850 | 9 |
| TiCN-2(HT) | $TiCl_4$: 1.0, $N_2$: 10, $CH_4$: 2.0, $H_2$: balance | 1010 | 9 |
| TiAlCNO-1 | $TiCl_4$: 7.0, $CH_4$: 5.5, $N_2$: 5.0, CO: 0.5, $AlCl_3$: 1.5, $H_2$: balance | 1000 | 15 |
| TiCNO-1 | $TiCl_4$: 7.0, $CH_4$: 3.5, $N_2$: 15.0, CO: 1.0, $H_2$: balance | 1000 | 15 |
| $Al_2O_3$-1 | $AlCl_3$: 8.0, HCl: 0.5, $CO_2$: 1.0, $H_2$: balance | 1000 | 10 |
| $Al_2O_3$-2 | $AlCl_3$: 3.5, HCl: 2.0, $CO_2$: 1.0, $H_2S$: 0.5, $H_2$: balance | 1000 | 10 |
| $Al_2O_3$-3 | $AlCl_3$: 7.0, HCl: 1.0, $CO_2$: 1.0, $H_2S$: 0.5, $H_2$: balance | 1000 | 10 |
| $Al_2O_3$-4 | $AlCl_3$: 2.5→5.0, HCl: 2.0→0.5, $CO_2$: 1.3, $H_2S$: 0.1, $H_2$: balance | 1000 | 10 |
| $Al_2O_3$-5 | $AlCl_3$: 6.5, HCl: 1.0, $CO_2$: 1.5, $H_2$: balance | 1000 | 10 |
| $Al_2O_3$-6 | $AlCl_3$: 6.0, HCl: 1.0, $CO_2$: 1.2, $H_2S$: 0.4, $H_2$: balance | 1000 | 10 |
| $Al_2O_3$-7 | $AlCl_3$: 4.0, HCl: 2.0, $CO_2$: 3.0, $H_2S$: 0.7, $H_2$: balance | 970 | 20 |
| $Al_2O_3$-8 | $AlCl_3$: 8.0, HCl: 0.5, $CO_2$: 3.0, $H_2S$: 0.6, $H_2$: balance | 1050 | 10 |
| $Al_2O_3$-9 | $AlCl_3$: 5.0→12, HCl: 2.0→1.5, $CO_2$: 3.0, $H_2S$: 0.3, $H_2$: balance | 990 | 10 |
| $Al_2O_3$-10 | $AlCl_3$: 2.0, HCl: 5.0, $CO_2$: 1.0, $H_2$: balance | 1005 | 6 |
| TiN-2 | $TiCl_4$: 2.0, $N_2$: 40, $H_2$: balance | 1010 | 80 |

*$Al_2O_3$-4, $Al_2O_3$-9: The amounts of each gas ($AlCl_3$, $CO_2$, $H_2S$) in a mixed gas were changed from x to y continuously.

TABLE 2

| Sample No. | Coating layer[1] | | | | | | | | |
|---|---|---|---|---|---|---|---|---|---|
| | Underlayer | TiCN layer | | Intermediate layer | | $Al_2O_3$ layer | | | Surface layer |
| 1 | — | TiCN-1 (9) | TiCN-2 (0.2) | TiAlCNO-1 (0.2) | TiCNO-1 (0.1) | $Al_2O_3$-1 (<0.1) | $Al_2O_3$-2 (2) | $Al_2O_3$-3 (5) | TiN-2 (1.0) |
| 2 | TiN-1 (0.5) | TiCN-1 (9) | TiCN-2 (0.5) | TiAlCNO-1 (0.1) | TiCNO-1 (0.1) | $Al_2O_3$-1 (<0.1) | | $Al_2O_3$-4 (7) | TiN-2 (2.0) |
| 3 | TiN-1 (0.5) | TiCN-1 (12) | TiCN-2 (0.1) | TiAlCNO-1 (0.05) | TiCNO-1 (0.05) | $Al_2O_3$-5 (<0.1) | $Al_2O_3$-2 (3) | $Al_2O_3$-6 (4) | TiN-2 (1.5) |

TABLE 2-continued

| Sample No. | Coating layer[1] | | | | | | | | Surface layer |
|---|---|---|---|---|---|---|---|---|---|
| | Underlayer | TiCN layer | | Intermediate layer | | Al₂O₃ layer | | | |
| 4 | TiN-1 (1.0) | TiCN-1 (8) | TiCN-2 (0.3) | TiAlCNO-1 (0.1) | TiCNO-1 (0.1) | Al₂O₃-1 (<0.1) | Al₂O₃-7 (1) | Al₂O₃-8 (6) | — |
| 5 | TiN-1 (0.5) | TiCN-1 (6) | TiCN-2 (0.5) | — | TiCNO-1 (0.5) | Al₂O₃-1 (<0.1) | Al₂O₃-9 (7) | | TiN-2 (3.0) |
| 6 | TiN-1 (1.0) | TiCN-1 (6) | TiCN-2 (0.5) | TiAlCNO-1 (0.1) | TiCNO-1 (0.1) | Al₂O₃-2 (7) | | | TiN-2 (1.0) |
| 7 | TiN-1 (0.5) | TiCN-1 (9) | TiCN-2 (0.1) | TiAlCNO-1 (0.1) | TiCNO-1 (0.1) | Al₂O₃-5 (<0.1) | Al₂O₃-3 (2) | Al₂O₃-2 (5) | TiN-2 (0.5) |
| 8 | TiN-1 (0.5) | TiCN-1 (10) | TiCN-2 (0.3) | TiAlCNO-1 (0.1) | TiCNO-1 (0.1) | Al₂O₃-4 (7) | | | TiN-2 (2.0) |
| 9 | TiN-1 (1.0) | TiCN-1 (8) | TiCN-2 (0.3) | TiAlCO-1 (0.1) | TiCO-1 (0.1) | Al₂O₃-1 (<0.1) | Al₂O₃-7 (1) | Al₂O₃-8 (6) | TiN-2 (0.5) |
| 10 | TiN-1 (1.0) | TiCN-1 (8) | TiCN-2 (0.3) | TiAlCO-1 (0.1) | — | Al₂O₃-1 (<0.1) | Al₂O₃-7 (1) | Al₂O₃-8 (6) | TiN-2 (1.0) |
| 11 | TiN-1 (1.0) | TiCN-1 (8) | TiCN-2 (0.1) | TiAlCNO-1 (0.2) | TiCNO-1 (0.1) | Al₂O₃-1 (<0.1) | Al₂O₃-2 (3) | Al₂O₃-3 (4) | TiN-2 (2.0) |

*[1]Values in parentheses represent the layer thickness in μm.

TABLE 3

| | Texture coefficient Tc of Al₂O₃ layer | | | | | | | | | Surface side peak | |
|---|---|---|---|---|---|---|---|---|---|---|---|
| | | | | | | | | | | First most- | Second most- |
| Sample No. | Tc1 (146) | Tc2 (146) | Tc3 (146) | Tc1 (116) | Tc2 (116) | Tc3 (116) | Tc1 (104) | Tc2 (104) | Tc3 (104) | intense peak | intense peak |
| 1 | 1.0 | 0.5 | 1.2 | 0.9 | 0.4 | 0.7 | 2.2 | 0.7 | 2.2 | (104) | (116) |
| 2 | 2.5 | 1.1 | 1.8 | 1.6 | 0.4 | 1.4 | 2.6 | 1.1 | 2.3 | (116) | (104) |
| 3 | 2.0 | 0.8 | 1.7 | 1.1 | 0.3 | 1.0 | 2.1 | 0.5 | 2.1 | (104) | (116) |
| 4 | 2.8 | 1.2 | 1.5 | 2.2 | 0.7 | 1.7 | 3.2 | 1.8 | 2.7 | (104) | (116) |
| 5 | 1.5 | 0.7 | 1.0 | 0.8 | 0.5 | 0.7 | 1.8 | 1.5 | 1.8 | (110) | (104) |
| 6 | 0.9 | 0.6 | 0.8 | 1.3 | 0.4 | 1.2 | 2.0 | 1.2 | 2.1 | (104) | (012) |
| 7 | 0.7 | 0.9 | 0.5 | 0.6 | 0.7 | 0.5 | 2.0 | 1.7 | 2.0 | (012) | (110) |
| 8 | 0.8 | 0.8 | 0.9 | 1.0 | 0.4 | 0.9 | 1.7 | 0.8 | 1.8 | (104) | (110) |
| 9 | 3.6 | 1.5 | 2.0 | 2.3 | 0.7 | 1.9 | 3.4 | 1.9 | 2.9 | (104) | (116) |
| 10 | 3.1 | 1.3 | 1.9 | 2.3 | 0.7 | 1.8 | 3.5 | 2.0 | 2.8 | (104) | (116) |
| 11 | 1.0 | 0.5 | 1.0 | 0.9 | 0.4 | 0.9 | 2.2 | 0.7 | 2.2 | (104) | (116) |

TABLE 4

| Sample No. | Cutting performance | | |
|---|---|---|---|
| | Crater wear width Kb (mm) | Flank wear width Vb (mm) | Number of impacts |
| 1 | 0.22 | 0.17 | 3200 |
| 2 | 0.13 | 0.13 | 3550 |
| 3 | 0.17 | 0.15 | 3300 |
| 4 | 0.12 | 0.10 | 3700 |
| 5 | 0.28 | 0.21 | 3050 |
| 6 | 0.40 | 0.33 | 2650 |
| 7 | 0.46 | 0.45 | 2200 |
| 8 | 0.36 | 0.30 | 2550 |
| 9 | 0.11 | 0.09 | 3800 |
| 10 | 0.11 | 0.10 | 3750 |
| 11 | 0.29 | 0.18 | 3100 |

According to the results shown in Tables 1 to 4, in sample Nos. 6 to 8, in each of which the Tc1 (146) value was less than 1.0, the progression of wearing was rapid and the aluminum oxide layer was detached easily by the application of an impact.

On the other hand, in sample Nos. 1 to 5 and 9 to 11, in each of which the Tc1 (146) value was 1.0 or more, the fine chipping in the aluminum oxide layer was prevented and the aluminum oxide was rarely detached. Particularly, in sample Nos. 1 to 4 and 9 to 11, in each of which faces (104) and (116) respectively had the first most-intense peak and the second most-intense peak among the surface side peaks of the aluminum oxide layer, the flank wear widths were smaller compared with that of sample No. 5 and the number of impacts was large. Furthermore, in sample Nos. 2, 4, 9 and 10, in each of which the texture coefficient Tc3 (104) of the surface side peak in the rake surface was smaller than the texture coefficient Tc1 (104) of the surface side peak in the flank surface, particularly the crater wear width was small.

DESCRIPTION OF THE REFERENCE NUMERALS

1: Cutting tool
2: Rake surface
3: Flank surface
4: Cutting edge
5: Base material
6: Coating layer
7: Underlayer
8: Titanium carbonitride layer
8a: MT-titanium carbonitride layer
8b: HT-titanium carbonitride layer
9: Intermediate layer
9a: Lower intermediate layer 9b: Upper intermediate layer
10: Aluminum oxide layer
11: Surface layer

What is claimed is:
1. A coated tool comprising,
a base material comprising a first surface and a second surface; and
coating layers located over the base material and comprising,
   a first layer including titanium carbonitride and located over the base material, and
   a second layer including aluminum oxide having an alpha-type crystal structure and located over the first layer; wherein
the second layer comprises a first portion located over the first surface and a second portion located over the second surface, and
a texture coefficient Tc1 (146) as measured on an outermost surface of the first portion is 1 or more, wherein the texture coefficient Tc (hkl) is a value expressed by the formula shown below on the basis of a peak of the second layer analyzed by an X-ray diffraction analysis:

a texture coefficient $Tc(hkl) = \{I(hkl)/I_0(hkl)\}/[(1/8) \times \Sigma\{I(HKL)/I_0(HKL)\}]$ wherein (HKL) represents a crystal face (012), (104), (110), (113), (024), (116), (214) or (146);
   each of I(HKL) and I(hkl) represents a peak intensity of a peak which is attributed to each crystal face and is detected by an X-ray diffraction analysis of the second layer; and
   each of $I_0$(HKL) and $I_0$(hkl) represents a reference diffraction intensity of each crystal face contained in a JCPDS card No. 00-010-0173.

2. The coated tool according to claim 1, wherein a texture coefficient Tc2 (146) is smaller than the Tc1 (146), wherein the texture coefficient Tc2 (146) is measured on a surface of the first portion in which 10-40 percent of a thickness of the first portion is removed by polishing.

3. The coated tool according to claim 1, wherein one of I(116) and I(104) is the first most-intense peak and another one of I(104) and I(116) is the second most-intense peak among surface side peaks detected in measurement on the outermost surface of the first portion.

4. The coated tool according to claim 1, wherein a texture coefficient Tc3 (104) which is measured from above a top surface of the second portion is smaller than a texture coefficient Tc1 (104) which is measured on the outermost surface of the first portion.

5. The coated tool according to claim 1, wherein the top surface of the first portion comprises a flank surface.

6. The coated tool according to claim 1, wherein a top surface of the second portion comprises a rake surface.

7. The coated tool according to claim 1, wherein the texture coefficient Tc1 (146) is in a range of 1 to 5.

* * * * *

UNITED STATES PATENT AND TRADEMARK OFFICE
CERTIFICATE OF CORRECTION

PATENT NO.         : 10,369,632 B2
APPLICATION NO.    : 15/506804
DATED              : August 6, 2019
INVENTOR(S)        : Kensaku Watanabe et al.

It is certified that error appears in the above-identified patent and that said Letters Patent is hereby corrected as shown below:

In the Specification

Column 3, Line 61, change 'thermalexpansion' to -- thermal expansion --.
Column 3, Line 62, change 'thermalexpansion' to -- thermal expansion --.

Signed and Sealed this
Twenty-eighth Day of July, 2020

Andrei Iancu
*Director of the United States Patent and Trademark Office*